US006961186B2

(12) United States Patent
Pierrat et al.

(10) Patent No.: US 6,961,186 B2
(45) Date of Patent: Nov. 1, 2005

(54) CONTACT PRINTING USING A MAGNIFIED MASK IMAGE

(75) Inventors: Christophe Pierrat, Santa Clara, CA (US); Alfred Kwok-Kit Wong, Brookline, MA (US)

(73) Assignee: Takumi Technology Corp., Sunnyvale, CA (US)

( * ) Notice: Subject to any disclaimer, the term of this patent is extended or adjusted under 35 U.S.C. 154(b) by 18 days.

(21) Appl. No.: 10/672,620

(22) Filed: Sep. 26, 2003

(65) Prior Publication Data

US 2005/0068639 A1 Mar. 31, 2005

(51) Int. Cl.⁷ .................................................. G02B 9/00
(52) U.S. Cl. ........................................ 359/649; 359/754
(58) Field of Search ................................ 359/649–651, 359/754–756, 763, 771, 784, 793

(56) References Cited

U.S. PATENT DOCUMENTS

| | | | |
|---|---|---|---|
| 5,121,256 A | 6/1992 | Corle et al. .................. | 359/664 |
| 5,469,299 A | 11/1995 | Nagano ....................... | 359/661 |
| 5,982,558 A | 11/1999 | Furter et al. ................ | 359/649 |
| 6,198,576 B1 | 3/2001 | Matsuyama ................. | 359/649 |
| 6,522,484 B1 | 2/2003 | Schuster ...................... | 359/733 |
| 6,778,327 B2 * | 8/2004 | Pakdaman et al. .......... | 359/656 |
| 2004/0027675 A1 * | 2/2004 | Wu et al. .................... | 359/619 |
| 2004/0240047 A1 * | 12/2004 | Shafer et al. ............... | 359/366 |

OTHER PUBLICATIONS

French, Roger H., et al., "Fluoropolymers for 157nm Lithography: Optical Properties from VUV Absorbance and Ellipsometry Measurements," SPIE Proceedings, Microlithography 2000, 12 pages.

Flagello, Donis G., et al., "High–numerical–aperture eefects in photoresist," Applied Optics 36(34) (Dec. 1, 1997) 8944–8951.

French, Roger H., et al., "Materials Design and Development of Fluoropolymers for Use as Pellicles in 157nm Photolithography," Optical Microlithography XIV, Proceedings of SPIE vol. 4346 (2001).

Pierrat, Christophe, et al., "The MEF Revisited: Low k1 Effects versus Mask Topography Effects," Optical Microlithography XVI, Proceedings of SPIE vol. 5040 (Feb. 25, 2003).

Chiba, Yuji, et al., "New generation projection optics for ArF lithography," Optical Microlithography XV, Proceedings of SPIE vol. 4691 (2002), 679–686.

Baek, So–Yeon, et al., "Simulation Study of Process Latitude for Liquid Immersion Lithography," Optical Microlithography XVI, Proceedings of SPIE vol. 5040 (Feb. 27, 2003), 11 pages.

Pendry, J.B., et al., "Near–field lenses in two dimensions," J. Phys.: Condens. Matter 14 (2002) 8463–8479.

Ober, Christopher K., "Polymer Surfaces and Surface Analysis," Nanobiotechnology MSE 563/AEP 663 (2000), 43 pages.

Hafeman, Scott, et al., "Simulation of imaging and stray light effects in immersion lithography," Optical Microlithography XVI, Proceedings of SPIE vol. 5040 (Feb. 27, 2003), 13 pages.

* cited by examiner

*Primary Examiner*—Jordan M. Schwartz
(74) *Attorney, Agent, or Firm*—Russo & Hale LLP; William C. Milks, III (57) ABSTRACT

Improvements in the fabrication of integrated circuits are driven by the decrease of the size of the features printed on the wafers. Current lithography techniques limits have been extended through the use of phase-shifting masks, off-axis illumination, and proximity effect correction. More recently, liquid immersion lithography has been proposed as a way to extend even further the limits of optical lithography. This invention described a methodology based on contact printing using a projection lens to define the image of the mask onto the wafer. As the imaging is performed in a solid material, larger refractive indices can be obtained and the resolution of the imaging system can be increased.

21 Claims, 9 Drawing Sheets

CONTACT PRINTING USING A MAGNIFIED MASK IMAGE

REFERENCE TO RELATED APPLICATION

The present application is related to U.S. patent application Ser. No. 10/616,603 filed 10 Jul. 2003, entitled CONTACT OR PROXIMITY PRINTING USING A MAGNIFIED MASK IMAGE, invented by Pierrat, et al.

FIELD OF THE INVENTION

The invention relates to the process of fabricating semiconductor chips. More specifically, the invention relates to a lithographic method.

RELATED ART

Integrated circuit technology improvements are mostly driven by the decrease of the feature size of the semiconductor chips. As the feature size of the circuit decreases, circuit designers have to deal with the limitations of the lithography process used to manufacture the integrated circuits. The lithography process starts first by coating the surface of the semiconductor wafer with a material called resist. A source of radiation is then shone through the mask in the case of a transparent mask. For a reflective mask the radiation is reflected by the mask. The transparent mask is made of a substrate transparent to the radiation and coated with a patterned opaque layer defining clear and opaque regions to the radiation. Transparent masks are mostly used in optical lithography with typical wavelengths of 436 nm, 405 nm, 365 nm, 248 nm, 193 nm, and 157 nm. The reflective masks are made using a substrate reflective to the radiation and coated with a patterned non-reflective layer defining reflective and non-reflective regions to the radiation. Alternatively, a reflective mask could be made of a non-reflective substrate coated with a reflective layer. Reflective masks are mostly used for shorter radiation wavelength on the order of 13 nm usually referred to as EUV or Extreme Ultra Violet.

During the exposure to the radiation source, an image of the mask is formed using an optical system on top of the resist layer. Various optical systems can be used to produce an image of the mask. In the techniques called contact printing and proximity printing, the mask is placed in contact or in close proximity to the resist. Light is shone through the backside of the mask thereby exposing the entire resist-coated wafer through the openings of the mask. Since the mask image and the wafer image are of the same dimension, this technique was partially abandoned for volume manufacturing because of the tight requirements on the mask image and the difficulty to obtain good contact over the entire wafer area.

The main technique used today in volume production relies on the projection of the image of the mask onto the wafer. Typically the wafer image is reduced by a factor of 4 (usually named mask image magnification factor or wafer image demagnification factor) as compared to the mask image, thus relaxing the mask fabrication requirements. The field on the wafer corresponding to the image of the mask is exposed multiple times to cover the entire wafer. The entire field can be exposed in one shot, in this case the equipment is named a stepper.

Alternatively, the field can be scanned by moving the mask and the wafer relative to the projection lens. In this case the equipment is named a scanner. Scanners offer the advantage to mitigate some field non-uniformities observed in steppers but the scanning mechanism adds residual noise that partially degrades the aerial image. Moreover scanners show differences of the aerial image for features perpendicular to the scan direction versus features parallel to the scan direction. As the quality of the projection lenses improves, the advantage of scanners over steppers becomes less apparent.

The resist layer is exposed by the radiation passing through the mask in case of transparent mask or reflected by the mask in the case of a reflective mask. The resist is then developed in a developer bath and depending on the polarity of the resist (positive or negative), the exposed regions or the unexposed regions of the resist are removed. The end result is a semiconductor wafer with a resist layer having a desired pattern. This resist pattern can then be used by subsequent processing steps of the underlying regions of the wafer.

As the feature size decreases, distortion in the pattern transfer process becomes more severe. The design shapes must be modified in order to print the desired images on the wafer. The modifications account for the limitation in the lithography process. One such modification is referred to as Optical Proximity Correction (OPC) in the case of optical lithography. In the case of OPC, modifications of the design image account for optical limitations as well as mask fabrication limitations and resist limitations. Modifications of the design image can also account for the subsequent process steps like dry etching or implantation. It can also account for flare in the optical system as well as pattern density variations. Another application of proximity effect correction is the compensation of the effects of aberrations of the optical system used to print the image of the mask onto the wafers. In this case, a mask with aberration correction would be dedicated to a given lithography tool as the aberrations are tool-specific.

Figure 1:
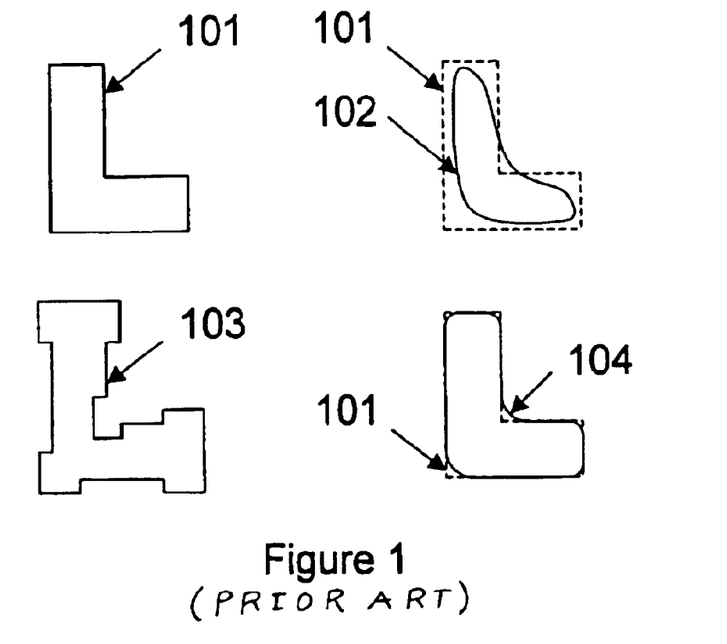
FIG. 1 illustrates the modification of the data to correct proximity effects.

FIG. 1 illustrates the modification of the mask data to correct for proximity effects. The processing of the mask data starts with a target layout 101 representing the desired dimensions of the image on the wafer. The printed image 102 of the target layout 101 differs from the desired image due to proximity effect. For reference, the target image 101 is shown with the printed image 102. The edges of the features are then moved (103) so that the corresponding printed image on the wafer 104 is correct (as close to the target as possible). In FIG. 1, all the areas of the layout have been corrected but different degrees of proximity effect correction aggressiveness can be applied to different regions depending on the criticality of the region in the integrated circuit.

The corrections to layout 101 can be applied using a rule-based approach or a model-based approach. For a rule-based approach (Rule-based OPC), the displacement of the segments would be set by a list of rules depending, for example, on the feature size and its environment. For a model-based approach (Model-based OPC), the printed image on the wafer would be simulated using a model of the pattern transfer process. The correction would be set such that the simulated image matches the desired wafer image. A combination of rule-based OPC and model-based OPC sometimes referred to as hybrid OPC can also be used.

Figure 2:
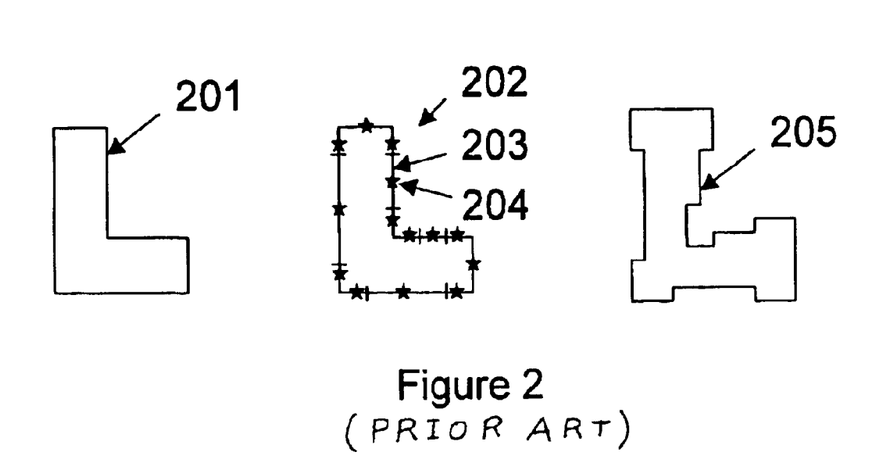
FIG. 2 illustrates the process flow used for model-based OPC.

In the case of model-based OPC, the original layout 201 as shown in FIG. 2 is dissected in smaller segments 203 shown in modified layout 202. Each segment is associated an evaluation point 204. The printed errors of the evaluation points are compensated by moving the corresponding segment in a direction perpendicular to the segment as shown in the final layout 205. The segments are corrected using multiple iterations in order to account for corrections of neighboring segments.

The image quality can be improved by adding printing or non-printing assist features along the edges of the main features. These assist features modify the diffraction spectrum of the pattern in a way that improves the printing of the main feature. The practical implementation of assist features is enhanced with the use of proximity effect correction as described above to correct for any optical printing artifact as well as resist and etch artifacts.

The image quality can also be improved by using phase-shifting masks. In this case, at least two different regions are created on the masks corresponding to different phase and transmission of the light either going through these regions (for transparent mask) or reflected by these regions (for reflective mask). The phase difference between the two regions is chosen to be substantially equal to 180 degrees. The destructive interference between adjacent regions of opposite phase creates a very sharp contrast at the boundary between the regions, thus leading to the printing of small features on the wafer. Two main classes of phase-shifting masks are in use today. For the first class, the amount of light transmitted for transparent masks (or reflected for reflective masks) by one region is only a portion of the light transmitted (or reflected) by the other region, typically 5% to 15%. These masks are referred to as attenuated phase-shifting masks or half-tone phase-shifting masks. In some implementations of attenuated phase-shifting masks, some opaque regions (for transparent masks) or non-reflective regions (for reflective masks) are defined on the mask in order to block the light. This type of mask is referred to as tri-tone mask. For the second class, the light transmitted (for transparent masks) or reflected (for reflective masks) by one region is substantially equal to the light transmitted (for transparent masks) or reflected (for reflective masks) by the other region. The second class of masks includes the following types of phase-shifting masks: alternating aperture phase-shifting masks, chromeless phase-shifting masks, and rim phase-shifting masks. The practical implementation of these techniques is improved with the use of proximity effect correction as described above to correct for any optical printing artifact as well as resist and etch artifacts. All the techniques can be combined with the use of assist features.

The image quality can also be improved by using off-axis illumination. To achieve off-axis illumination, the illuminator of the stepper or scanner is shaped in a way that only the light at certain angles with respect to the optical axis is used to create the image thereby favoring certain spatial frequencies of the mask pattern. The off-axis setting can be adjusted for a given feature size and type or for a collection of feature sizes and types. Off-axis illumination can be used in combination with binary masks, attenuated phase-shifting masks, chromeless phase-shifting masks, or rim phase-shifting masks. Off-axis illumination will also be improved by the use of proximity effect correction as described in a previous paragraph. Off-axis illumination can also be combined with the use of assist-features.

For the various techniques described above, i.e. proximity effect correction, phase-shifting masks, off-axis illumination, a very accurate model of the overall patterning process is required. This model strongly depends on the optical set up of the exposure tool used to expose the wafers. In particular, the wavelength of the light source, the numerical aperture of the projection lens and the illumination setting (partial coherence, off-axis illumination) are critical.

The limitation of current optical systems is driven by the following equation:

$$R = k_1 \lambda / NA$$

R=resolution
$\lambda$=wavelength of the illumination source
NA=numerical aperture of the exposure system The best resolution (or smallest line in a pattern made of equal lines and spaces) achieved for standard optical system is achieved for $k_1$=0.25. But for values of $k_1$ below 0.5, severe distortion of the pattern can be observed on the wafer thus requiring the correction of the mask in order to print the desired image on the wafer.

In spite of all the techniques described above, the theoretical limit of $k_1$=0.25 cannot be exceeded for current exposure tools. One approach that was recently proposed to extend the life of optical lithography is to create the image in a liquid having a high refractive index medium thereby reducing the wavelength of the light by the reflective index. The limitation of optical systems with immersion will be driven by the following equation:

$$R = k_1 \lambda / (n\ NA)$$

R=resolution
$\lambda$=wavelength in vacuum of the illumination source
NA=numerical aperture of the exposure system
n=refractive index of the immersion medium In this case, the $k_1$=0.25 limitation still holds but much smaller feature sizes can be printed. For example, for 193 nm wavelength, water was proposed as the immersion liquid. Water has a refractive of 1.437 at 193 nm, thereby lowering the smallest printable feature by a factor of 1.437. For 157 nm wavelength, a polymer referred to as PFPE (Perfluoropolyether) was proposed with a refractive index of 1.38. The main challenge of immersion lithography is the manufacturing of steppers and scanners capable of handling a film of liquid between the lens and the wafer without creating bubble or non-uniformities. The addition of an immersion film could result in vibration coupling between the stage and the lens. Moreover the resist used must be compatible with the immersion liquid. Another challenge is the limited availability of transparent liquids with a high refractive index at 193 nm or 157 nm. The printing of dies at the edge of the wafer also represents a challenge for liquid immersion lithography.

Another option would be to use solid immersion lithography as described in U.S. Pat. No. 5,121,256. In this case a solid immersion lens is added to an existing optical system and placed closely adjacent to the sample. The optical system images the mask onto the wafer and the immersion lens is shaped with a spherical surface and placed at a distance such that the beams enter the solid lens with no refraction. For today's exposure systems the distance between the lens and the wafer is on the order of a few millimeters while the field size image is on the order of 20 to 40 millimeters thus rendering the set up described in U.S. Pat. No. 5,121,256 not viable. Indeed, to image such a field size, the solid immersion lens would be too thick compared to the distance between the projection lens and the wafer. Moreover the set up proposed is limited by aberrations when a large field is imaged. Building two separate lenses, one objective lens and one solid immersion lens also puts extreme requirements on the alignment of the lenses (in all three directions), the vibration of the lenses, and the overall correction of the aberrations across the field.

Projection lenses used today for optical lithography are made of a large number of lens elements, typically on the order of 30 lens elements, as described for example in U.S. Pat. No. 6,522,484. The large number of lens elements is required in order to lower the aberration level across the field of the image. The shape of each lens elements is optimized by taking into account all the other lens elements. Each element is accurately positioned inside the lens assembly and kept in an environment where the pressure, temperature and atmosphere are controlled. These tight requirements make the use of two separate lenses as described in U.S. Pat. No. 5,121,256 impractical.

Another technique named nano-imprint lithography was proposed to overcome the limits of current lithographic systems. This technique relies on the fabrication of a mold by patterning, on a substrate, a reverse-tone image of the desired wafer resist image. The patterning of the mold uses high resolution lithographic techniques like for example electron beam lithography. The patterned surface of the mold is then pressed into a thin resist cast on the wafer. In this step, the structures defined on the mold surface are transferred into the resist film thus creating a thickness contrast pattern into the resist. An isotropic etching process is then used to remove any residual resist residues left at the bottom of the resist patterns. The imprint step can be facilitated by heating the resist to a temperature higher than its glass transition temperature. The resist turns into a viscous fluid than can easily be deformed. The drawback of this implementation is that the temperature of the resist needs to be increased during the imprint step and then decreased before the mold is removed thus leading to long processing time and possible distortion of the image due to thermal expansion. Another approach is to use a resist containing a polymer having a glass transition temperature close to the ambient temperature so that no temperature increase is needed to form the imprint. Another approach is to use a transparent mold. In this case a liquid resist can be used and the pattern formed by the mold can be "solidified" by exposing the resist from the backside of the mold. This technique is named in the literature "Step and Flash Imprint". These techniques present an advantage over contact printing in the fact that the deformable resist should follow more readily the contours of the mold. All these different variations of nano-imprint lithography rely on the creation of a very accurate mold that should be a replica of the ultimate pattern printed on the wafer, i.e. the mold image is at the same scale as the final wafer image. The difficulty of making such an accurate pattern is one of the main limitations of nano-imprint lithography.

SUMMARY

The present invention provides a lithography system based on a projection lens in which a final lens element has a surface adapted to be pressed against a sample and forming a depression at the surface of the sample facing the final lens element, and a stage that supports the sample in contact with the surface of the final lens element. The projection lens typically comprises a plurality of lens elements including a first lens element adapted to face a mask, and the final lens element. The final lens element comprises a solid material having a high index of refraction, or an index of refraction greater than one. For example, in systems projecting an image using radiation having a wavelength of about 193 nm, or having a wavelength of about 157 nm, the final lens element may comprise one of silicon dioxide, calcium fluoride, aluminum oxide, yttrium fluoride, lanthanum fluoride, strontium fluoride.

In embodiments of the invention, the plurality of lens elements of the projection lens demagnifies an object on the mask by a factor greater than 4 at an image plane on or near the sample. In some embodiments, the image plane is on or near the surface of the final lens element. In other embodiments, the index of refraction of the final lens element matches the index of refraction of the radiation sensitive layer on the sample.

The projection lens in typical embodiments comprises a plurality of lenses which are encased, to provide controlled atmosphere and temperature in the spaces among the lenses. The final lens element has a high index of refraction, and is adapted to be pressed against the radiation sensitive layer on the sample thus forming a depression at the surface of the radiation sensitive layer facing the final lens element. In one embodiment, the final lens element is a slab of high index of refraction material, which is adapted to be removed from the projection lens assembly for ease of replacement, and cleaning. In one embodiment, a soft layer is coated on top of the radiation sensitive layer. In one embodiment, a radiation sensitive material is dispensed on top of the sample before the final lens element is placed in contact with the sample.

Further embodiments of the invention comprise a lithography system that includes a projection lens which has one side adapted to be pressed against the sample and forming a depression at the surface of the sample facing the projection lens, and another side adapted to be placed in contact or in close proximity with the mask. In some embodiment, the side of the lens facing the mask comprises a removable slab of material.

The present invention also provides a method for manufacturing integrated circuits. The method includes providing a wafer having a layer adapted to be developed in response to radiation. Also, a layout object to be projected on the layer is provided. According to the method, the layer on the wafer which is sensitive to radiation is pressed against the final lens element of the projection lens thus forming a depression at the surface of the layer facing the final lens element. The object is imaged on the radiation sensitive layer by the projection lens. In some embodiments, a soft layer is coated on top of the radiation sensitive layer. In some embodiments, the final lens element is cleaned after exposure.

According to embodiments of the method, the step of imaging the object includes imaging the object at an image plane near a top surface of the radiation sensitive layer. Alternatively, the image plane may be placed anywhere within the radiation sensitive layer, according to the pattern being transferred, the characteristics of the material of the layer, and other factors.

In yet other embodiments of the invention, the method includes preventing adhesion of the lens element to the layer.

Also, embodiments of the invention include placing a mask including the object to be imaged, in contact or close proximity with another high index of refraction lens element of the projection lens.

Embodiment of the invention includes laying out the layout pattern on the mask to be imaged on the radiation-sensitive layer. Laying out includes applying proximity correction using a lithography model comprising, for an incident material different than air characterized by its refractive index and absorption coefficient, calculating fields in the resist, accounting for the incident material refractive index and absorption coefficient, performed using thin film optics or by solving Maxwell equations.

Embodiment of the invention includes laying out the layout pattern on the mask to be imaged on the radiation-sensitive layer. The layout pattern comprises an alternating aperture phase-shifting mask layout. Laying out includes applying proximity correction using a lithography model comprising, for an incident material different than air characterized by its refractive index and absorption coefficient, calculating fields in the resist, accounting for the incident material refractive index and absorption coefficient, performed using thin film optics or by solving Maxwell equations.

Embodiment of the invention includes applying an off-axis setting for the projection lens, the off-axis setting obtained using a lithography model comprising, for an incident material different than air characterized by its refractive index and absorption coefficient, calculating fields in the resist, accounting for the incident material refractive index and absorption coefficient, performed using thin film optics or by solving Maxwell equations.

Embodiment of the invention includes laying out the layout pattern on the mask to be imaged on the radiation-sensitive layer. The layout pattern comprises an assist feature having a size and a distance from a corresponding main feature, and laying out includes determining said size and distance using a lithography model comprising, for an incident material different than air characterized by its refractive index and absorption coefficient, calculating fields in the resist, accounting for the incident material refractive index and absorption coefficient, performed using thin film optics or by solving Maxwell equations.

Embodiment of the invention includes laying out the layout pattern on the mask to be imaged on the radiation-sensitive layer. The layout pattern comprises an attenuated phase-shifting mask having sizing parameters, and laying out includes determining said sizing parameters using a lithography model comprising, for an incident material different than air characterized by its refractive index and absorption coefficient, calculating fields in the resist, accounting for the incident material refractive index and absorption coefficient, performed using thin film optics or by solving Maxwell equations.

Embodiment of the invention includes laying out the layout pattern on the mask to be imaged on the radiation-sensitive layer. Laying out includes applying proximity correction using a lithography model comprising, for an incident material different than air characterized by its refractive index and absorption coefficient, dividing the refractive indices and absorption coefficients of all the materials in the wafer stack by the refractive index of the incident material.

BRIEF DESCRIPTION OF THE FIGURES

FIG. 3b illustrates a possible projection lens used in the optical lithography exposure tool described in FIG. 3a.

DETAILED DESCRIPTION

Figure 3A:
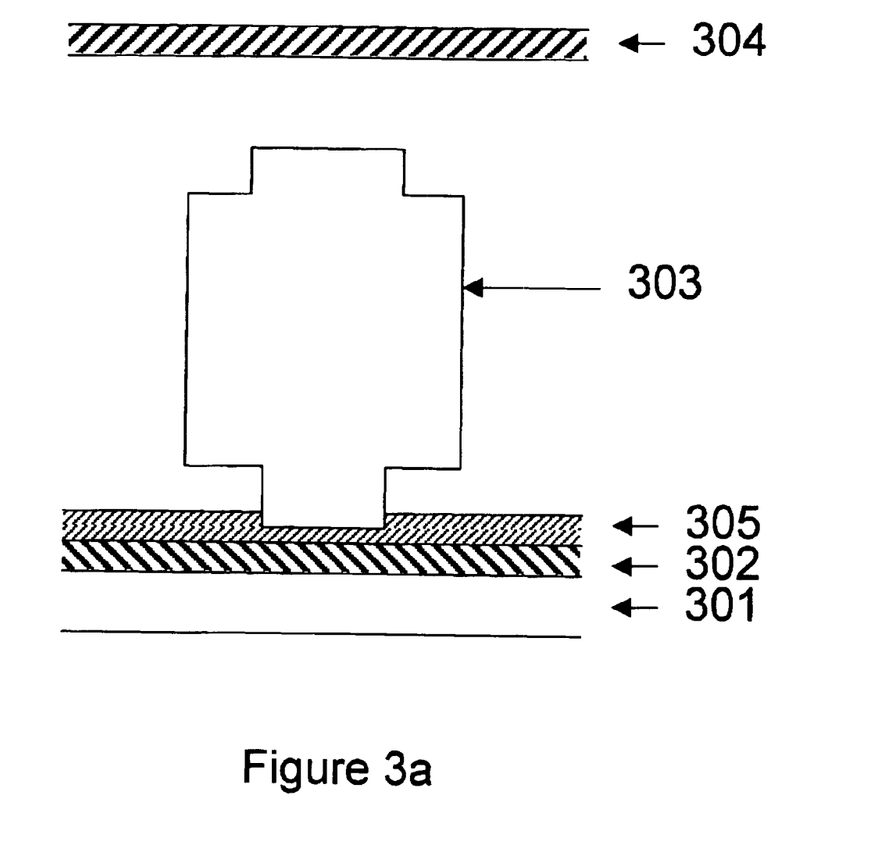
FIG. 3a illustrates an optical lithography exposure tool with the projection lens contacting and forming a depression in the resist.

A technique described in FIG. 3a was developed to address the issues encountered with immersion lithography. A wafer 302, coated with a resist 305 is placed on the stage 301. The projection lens 303 projects an image of the mask 304 inside the resist 305. The resist layer is deformable so that the bottom surface of the lens is pushed inside the resist layer at a certain distance from the top of the nominal resist height. The depression in the resist can be obtained by displacement if the resist is a liquid or by compression if the resist is made of a deformable material. The quality of the contact between the lens and the resist is guaranteed by the fact that the lens is pushed inside the resist in a similar fashion as in the case of nano-imprint lithography. In this case, the absence of patterns at the surface of the lens or at the surface of the resist allows for a better contact with no gaps. Inserting an immersion lens as described in the U.S. Pat. No. 5,121,256 is not required since the image of the mask is created in the vicinity of the bottom surface (surface facing the wafer) of the last lens element of the projection lens 303. This set up allows the reduction of potential aberrations of the images created by the lens.

To obtain a low viscosity resist film, the resist can be dispensed in a liquid form on the wafer before the lens is put in contact with the resist. Upon exposure, the resist film could be cross-linked in order to ensure the integrity of the final pattern. For example, the resist can be made of a monomer combined with a photo-acid generator. The photo-acid generator releases an acid upon exposure which catalyses the cross-linking reaction of the monomer. Resist materials similar to the one described by S. C. Johnson et al., SPIE Microlithography Conference, February 2003, can be used. For example, vinyl ethers can be used as monomers and sulfonium salts can be used as photo-acids.

Another possibility would be to use a resist having a low glass transition at room temperature (typically below 40 degree celcius). Existing resist formulated for 248 nm, 193 nm, or 157 nm lithography can be reformulated to lower the glass transition temperature of the coated resist film. This can be achieved by adding a plasticizing agent to the resist formulation, or by lowering the molecular weight of the polymer, or by replacing the polymer with a polymer having a lower glass transition temperature.

Another possibility is to coat a soft layer on top of the resist. The soft layer is deformable so that the bottom surface of the lens is pushed inside the soft layer at a certain distance from the top of the nominal soft layer height. The quality of the contact between the lens and the soft layer is guaranteed by the fact that the lens is pushed inside the soft layer in a similar fashion as in the case of nano-imprint lithography. After exposure, the soft layer is removed and the resist is developed. The soft layer could be made of a polymer with low glass transition temperature. If the glass transition temperature is too high, it can be lowered by adding a plasticizing agent to the resist formulation, or by lowering the molecular weight of the polymer. An example of potential material for the soft layer is polyvinyl alcohol. The advantage of polyvinyl alcohol is that it can be easily coated on top of existing resist without dissolving the resist. For this purpose, water can be used as the solvent of polyvinyl alcohol and water is not a solvent of existing resists. After exposure, the polyvinyl alcohol layer can be dissolved in water or in the aqueous developer used to develop the resist images.

Figure 3B:
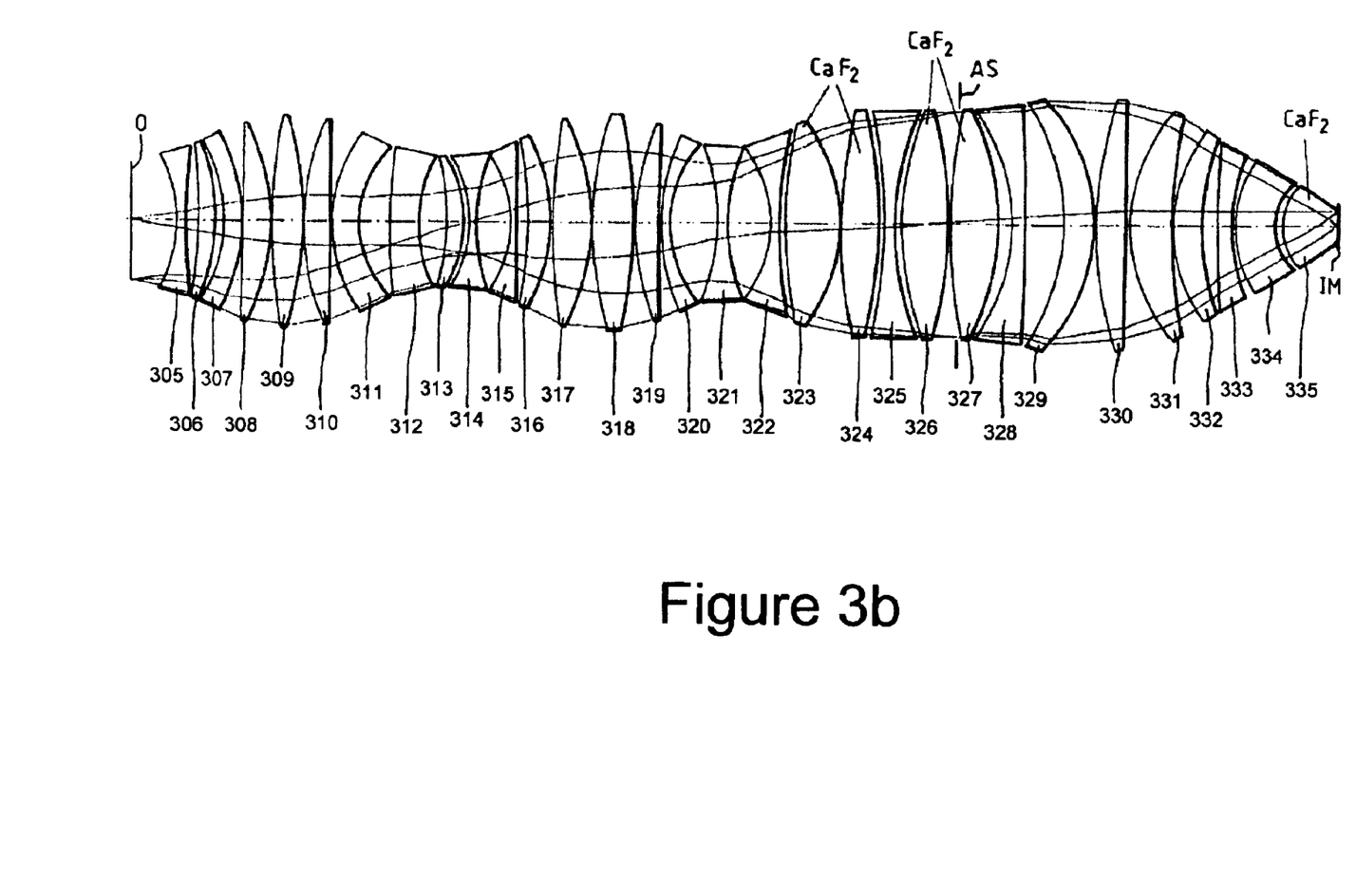

A possible lens implementation is shown in FIG. 3b. The object plane, i.e. the mask is represented by O and the image plane, i.e. the wafer position is represented by IM. The image of the object is formed at the image plane in the vicinity of the surface of the last lens element 335. The surface of the last element 335 is placed in contact with the wafer. The lens elements are placed in an environment control casing not shown on the drawing. The temperature, pressure, and atmosphere are precisely controlled in the environment of the casing.

The material of the last lens element needs to be chosen with the highest possible refractive index in order to achieve the best resolution. At the same time the material must be compatible with all other lens requirements including for example the fact that the material must be transparent. For 193 nm lithography, the best candidate for immersion lithography is water with a refractive index of approximately 1.437. The best candidates for 193 nm lens materials are given in the following table:

| Material | Refractive Index (193 nm) |
| --- | --- |
| $Al_2O_3$ | 1.88 |
| $CaF_2$ | 1.5 |
| $SiO_2$ | 1.56 |
| $YF_3$ | 1.55 |
| $SrF_2$ | 1.55 |
| $LaF_3$ | 1.63 |

For 157 nm lithography, the best candidate for immersion lithography are PFPE (perfluoropolyethers) with a refractive index of approximately 1.38. The best candidates for 157 nm lens materials are given in the following table:

| Material | Refractive Index (157 nm) |
| --- | --- |
| $CaF_2$ | 1.56 |
| $SiO_2$ | 1.69 |
| $YF_3$ | 1.64 |
| $SrF_2$ | 1.62 |
| $LaF_3$ | 1.72 |

For both 193 nm and 157 nm wavelengths, the refractive indices for the lens materials are higher than the best liquid immersion materials available thus enabling this technique to resolve smaller resist feature sizes than liquid immersion lithography. Some of the materials listed as potential candidates for the lens material, i.e. $CaF_2$ and $SiO_2$, are already used today in the manufacturing of lenses for 193 nm and 157 nm lithography. The lens manufacturing process could use the same material as for conventional lenses, only the overall design of the lens needs to be changed so that the image of the mask is created in the vicinity of the boundary of the last lens element. The exact location of the image of the mask will need to be chosen carefully such that the image is created at the best location with respect to the resist. Typically the image should be formed inside the resist. The exact location will depend on the resist thickness, on the resist refractive index, and on the resist processing characteristics. For some resist the image should be formed closer to the top of the resist, for other resists the image should be closer to the bottom of the resist. The difference in best image position can be attributed to differences in chemistry and to different processing conditions like for example, pre-bake time and temperature, post-exposure bake time and temperature, developer normality, development time and temperature.

Alternatively, as current projection lenses are made of multiple lens elements, only the last element could be made of a high refractive index material in order to achieve the best possible resolution. For example a lens for 193 nm lithography could use $CaF_2$ and $SiO_2$ for all the lens elements except for the last element in contact with the resist that could be made of $Al_2O_3$. For a 157 nm lens, all elements could be made of $CaF_2$ except for last element in contact with the resist that could be made of $LaF_3$. The material chosen for the last lens element should be able to withstand the radiation exposure with minimal degradation.

Figure 4:
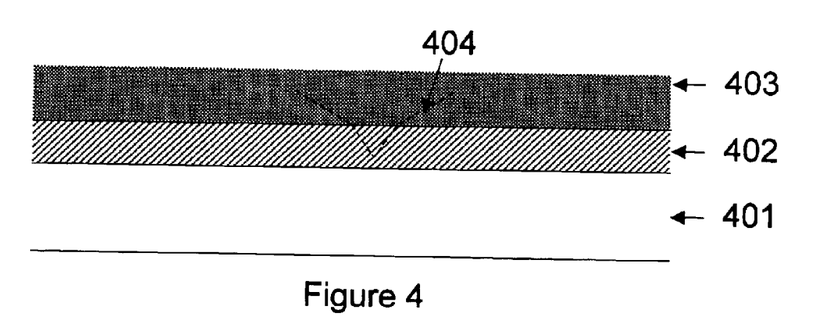
FIG. 4 depicts the interface between the lens and the resist.

FIG. 4 shows a detailed view of the lower surface of the projection lens 403 in contact with the resist 402 coated on the wafer 401. Marker 404 indicates light beams propagating through the projection lens 403 and creating an image inside the resist 402. FIG. 4 assumes that the refractive index of the lens material is lower than the refractive index of the resist and the beams at the lens/resist interface are refracted following Snell's law:

$$n_1 \cdot \sin(i_1) = n_2 \cdot \sin(i_2)$$

where $n_1$ is the refractive index of the lens material, $n_2$ the refractive index of the resist, $i_1$ the angle between the beam inside the lens material and the optical axis, $i_2$ the angle between the beam inside the resist and the optical axis. The refraction of the beams entering the resist will create an aberration of the image inside the resist equivalent to spherical aberration.

Figure 5:
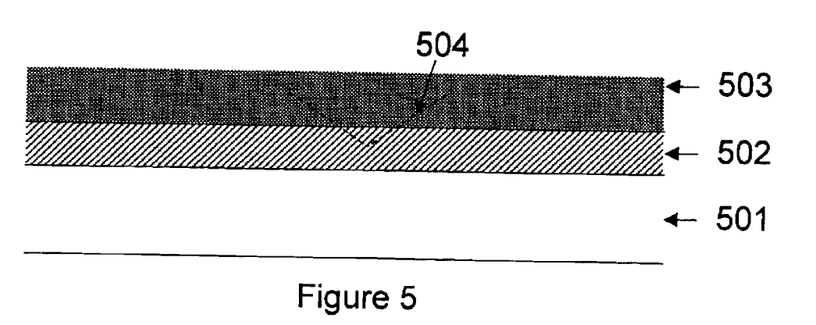
FIG. 5 depicts the interface between the lens and the resist when the refractive index of the lens is matching the refractive index of the resist.

The aberration can be reduced if $n_1$ and $n_2$ are substantially the same as shown in FIG. 5. In this case the previous formula shows that $i_1$ and $i_2$ are substantially equal. The beams propagating through the lens enter the resist with minimal direction change and the aberration effect is therefore reduced. The lens material could be chosen to achieve a good refractive index match with the resist. Vice-versa, the resist composition could be modified to match the refractive index of the material of the last lens element. The composition of the resist could also be modified so that the refractive index of the resist is larger than the refractive index of the last lens element in order to ensure that no resolution loss occurs at the interface between the resist and the lens.

For all the cases described above the mask is placed in air or in a purged environment for 157 nm lithography as air attenuates the 157 nm radiation. Under these conditions, the diffraction pattern emanating from the mask and captured by the projection lens could be limiting the resolution of the image created on the wafer. A magnification of the mask image is required if the mask is imaged in air. The condition imposed on the magnification of the mask is as follows:

$$m > n_w / n_m$$

where m is the magnification of the image on the mask compared to the image on the wafer, $n_m$ is the refractive index of the material in contact or in close proximity with the mask and $n_w$ is the refractive index of the material in contact with the wafer. In general, the resolution of the image created on the wafer is limited by the minimum of the refractive index of the last lens element, the refractive index of the resist, and the refractive index of any material that could be present in-between the last lens element and the resist. These limitations apply to any type of optical system currently in use and even apply to future imaging systems using liquid immersion lithography.

Using this technique, very small features will be printed on the wafer using a relatively large wavelength as measured in the air. The originating mask features will be small as well and given by the following equation:

$$MFS = m\, k_i\, \lambda/(n\, NA)$$

where MFS is the mask feature size. For example, if NA=0.85, $k_1$=0.3, n=1.5, m=4, then MFS=0.67 λ. The mask feature size is actually smaller than the wavelength. A magnification of 4 is the standard for today's scanners and steppers. While the mask feature size is small compared to the wavelength, the thickness of the mask absorber is relatively large compared to the wavelength, typically the chrome absorber thickness is on the order of 70 nm for advanced masks. The high aspect ratio of the mask features creates large scattering at the edges of the mask feature that will degrade the mask transmission and ultimately the quality of the aerial image printed on the wafer. Moreover the problem becomes more acute for alternating phase-shifting masks as the quartz substrate is etched to create a 180 degree phase-shift by a depth given by the following equation:

$$d = \lambda/2(n_s - 1)$$

where $n_s$ is the refractive index of the mask substrate. If the alternating aperture mask is created using an additive process, a shifter layer is coated and patterned on top of the chrome features. The thickness of the shifter layer is given by the following equation:

$$d = \lambda/2(n_{Sh} - 1)$$

where $n_{Sh}$ is the refractive index of the shifter layer. In the case of alternating aperture phase-shifting mask the aspect ratio is larger and the effect of scattering is more severe. For resolving smaller feature size compared to the exposure wavelength, a larger magnification should be used for example 5, 6 or 7. Integer number for the mask magnification is not required but it is preferred as it simplifies the scaling of the wafer data to create the mask. In particular, it makes it easier to put the mask data on a grid compatible with the mask write tools. The limitation brought up by mask scattering effects at the edge of high aspect ratio features and the idea of increasing the mask magnification accordingly applies to any types of optical system currently in use and even applies to future imaging systems using liquid immersion lithography.

Figure 6:
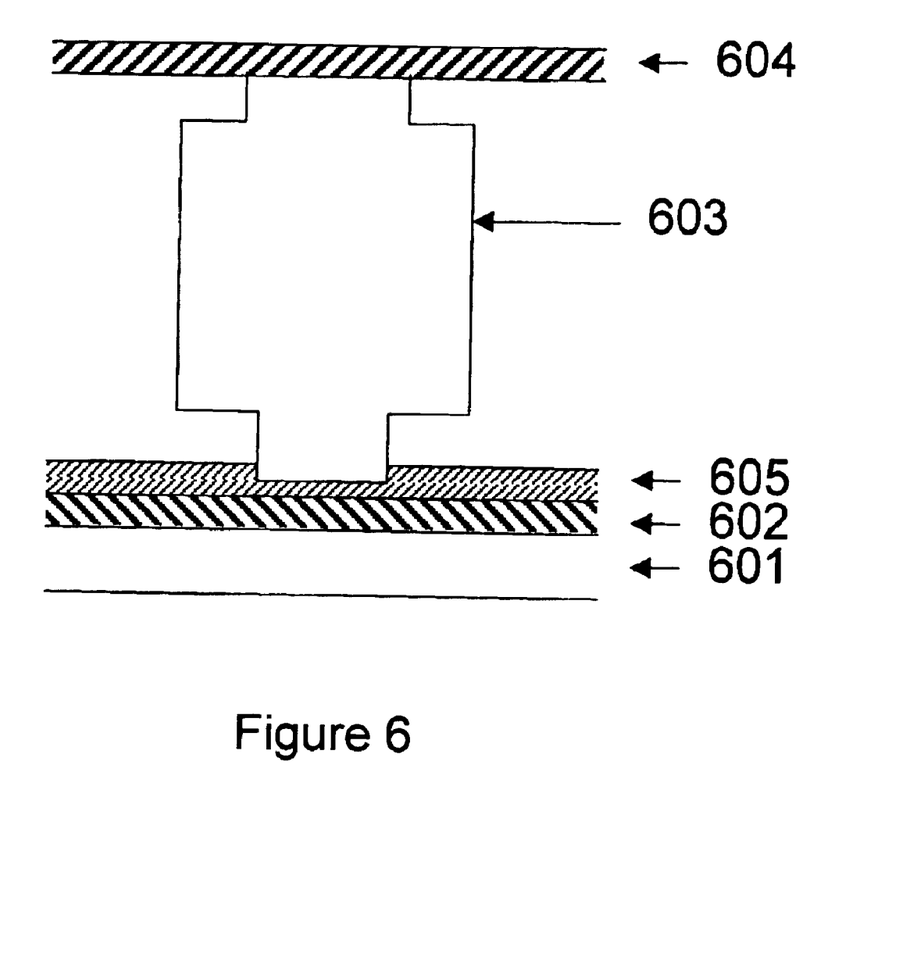
FIG. 6 illustrates an optical exposure tool with the projection lens placed in contact or close proximity to the mask and contacting and forming a depression in the resist.

Another way to solve this problem would be to immerse the mask side of the imaging systems in high index liquid, or place the mask surface in contact or close proximity with a high index solid lens element, as well as the target wafer. This can be accomplished for the optical systems described in the present invention but also for any type of optical system currently in use and including future imaging systems using liquid immersion lithography. FIG. 6 shows a drawing representing such a system as an extension of the system described in FIG. 3a. A wafer 602, coated with a resist 605, is placed on the stage 601. The projection lens 603 projects an image of the mask 604 inside the resist 605. The resist layer is deformable so that the bottom surface of the lens is placed inside the resist layer at a certain distance from the top of the nominal resist height. Another possibility is to coat a soft layer on top of the resist. The soft layer is deformable so that the bottom surface of the lens is pushed inside the soft layer at a certain distance from the top of the nominal soft layer height. The quality of the contact between the lens and the soft layer is guaranteed by the fact that the lens is pushed inside the soft layer in a similar fashion as in the case of nano-imprint lithography. After exposure, the soft layer is removed and the resist is developed. The soft layer could also be removed at the same time the resist is developed if the soft layer is soluble in the resist developer. The top of the lens is placed either in close proximity or in contact with the mask 604. This type of set up would limit the constraints on the mask magnification described above. This type of set-up precludes the use of a standard pellicle on the mask. On the other hand a thick film of pellicle material could be coated on the mask in order to prevent particles form contaminating the surface of the mask.

In all the cases described in FIGS. 3a, 4, 5, and 6 the distance between the lens and the wafer is set by some mechanical constraints. The contact mode can be precisely adjusted by monitoring the pressure exerted by the wafer stage on the lens. One method to monitor the gap distance is to use an interferometer, where the waves reflected by the surface of the resist and the waves reflected by the bottom of the resist are interfered.

As the distance between the lens and the resist is fixed because of the nature of the imaging technique used, the position of the image in the direction perpendicular to the resist surface can be changed by adjusting the position of the mask with respect to the lens. As the focus position inside the resist is set by the optical system, a better control of the image position within the resist should be obtained compared to conventional exposure tool. For conventional exposure tools like steppers or scanners, the image position within the resist, i.e. the focus setting, is adjusted by moving up or down the wafer stage with respect to the lens which may lead to positioning inaccuracies. In addition the effect of vibrations or vibration coupling should be minimized in contact mode as described in the present invention.

One of the main differences between this technique and current lithography techniques is that the lens is in contact with the resist coated on the wafer which increases the risk of contamination of the lens and of the wafer. In order to prevent the contamination of the lens or of the wafer, a thin layer preventing the adhesion of the resist to the lens can be coated on top of the lens. This layer can be made for example of a fluoro-polymer similar to the one used for mask pellicle. This type of material presents the advantage of being transparent to short wavelengths and to reduce surface tension. The refractive index of this film should be chosen high enough not to limit the resolution of the printed images by total reflection.

Another option is to treat the surface of the lens with a fluorinated compound. If the last lens element is made of quartz, trichlorosilanes create covalent bounds at the surface of the lens. An example of trichlorosilane would be tridecafluoro-1,1,2,2, tetrahydrooctyltrichlorosilane.

The resist chemistry can also be changed to lower surface tension. Resist can also be made of fluoro-polymers combined with photo-acid generators. Upon irradiation, the photo-acid generator generates an acid that can de-protect chemical functions on the fluoro-polymer that are soluble in the resist developer. The resist would then be a positive resist. Alternatively soluble functions could be removed (negative resist) or photo-base generators could be used. To obtain a sufficiently low viscosity, the fluoro-polymer would have to be chosen with a low glass temperature.

In order to improve the contact between the lens and the wafer, the wafer surface should be as flat as possible. Techniques such as chemical mechanical polishing can be used to improve the wafer surface flatness. Dummy fill patterns placed in sparse areas of the layout can be combined with chemical mechanical polishing to further improve the flatness.

The contact between the lens and the wafer can also be improved by using resists specially formulated to create a planar coating of the topography of the wafer. The resist can also be formulated to conform to the surface of the lens when the lens and the wafer are put in contact.

To avoid any printing degradation due to the lens cleanliness, the surface of the lens that was in contact with the wafer can be inspected and cleaned after a certain number of exposures. Preferably, both the inspection and the cleaning systems should be placed either on the wafer stage or in the near proximity of the stage to minimize throughput loss. Many different inspection techniques can be used. A laser system can be used to scan the surface of the lens at a grazing incidence. Any change in the amount of light reflected by the surface indicates the presence of a defect. A pinhole combined with a detector could be used to monitor the uniformity of the aerial image of the lens. A phase measurement interferometer could be used to monitor the uniformity of the wave-fronts across the field.

If defects have been found during the inspection step, the lens surface should be cleaned. The cleaning process can combine wet and dry cleaning methods similar to the techniques used for cleaning wafers or photo-mask in order to remove resist residues or particles. The portion of the lens that was in contact with the wafer could be immersed in liquid chemical capable of dissolving the resist residues, and then dried. The wet cleaning step could be performed in combination with acoustic waves (typically 750 to 1000 kHz) in order to dislodge any particle left on the lens surface. The portion of the lens that was in contact with the wafer could be placed in a plasma environment. The plasma could contain oxygen or nitrogen as the byproducts of the reaction of polymer with oxygen or nitrogen are volatile compounds like for example $H_2O$, CO, $CO_2$ in the case of oxygen. Another technique involves the use of UV radiation combined with an atmosphere of ozone. The UV radiation could be generated by an external source or could be generated by the exposure tool source itself.

Another way to clean the last lens elements would be to try to blow the particles away by blowing nitrogen on the contaminated surface. Alternatively, a vacuum cleaning technique could be used in order to suck away the particles.

To address the issue where the lens surface cannot be cleaned, the lens could be built in such as way that the last element of the lens can be removed and replaced. For example the last lens element in contact with the wafer could be a disposable sheet of the high refractive index material.

Figure 7:
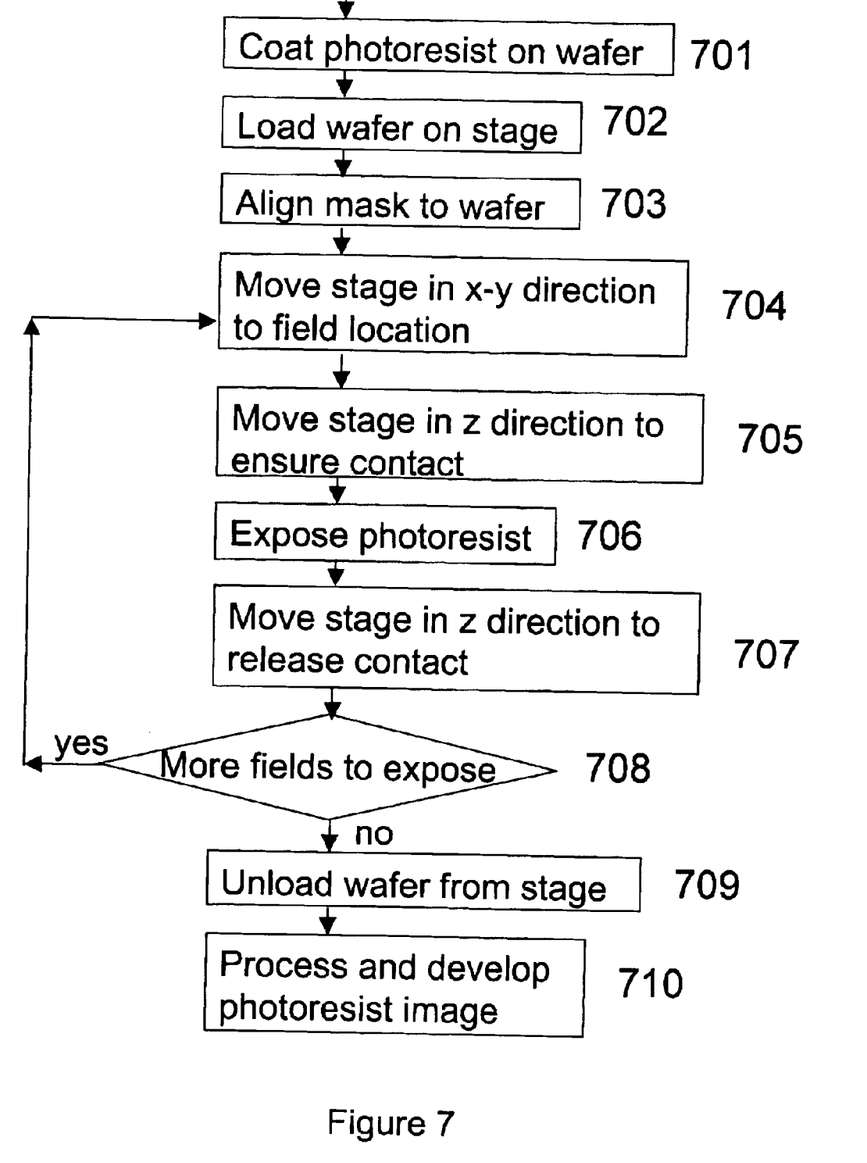
FIG. 7 illustrates the methodology used to expose wafers with a global wafer to mask alignment.
Figure 8:
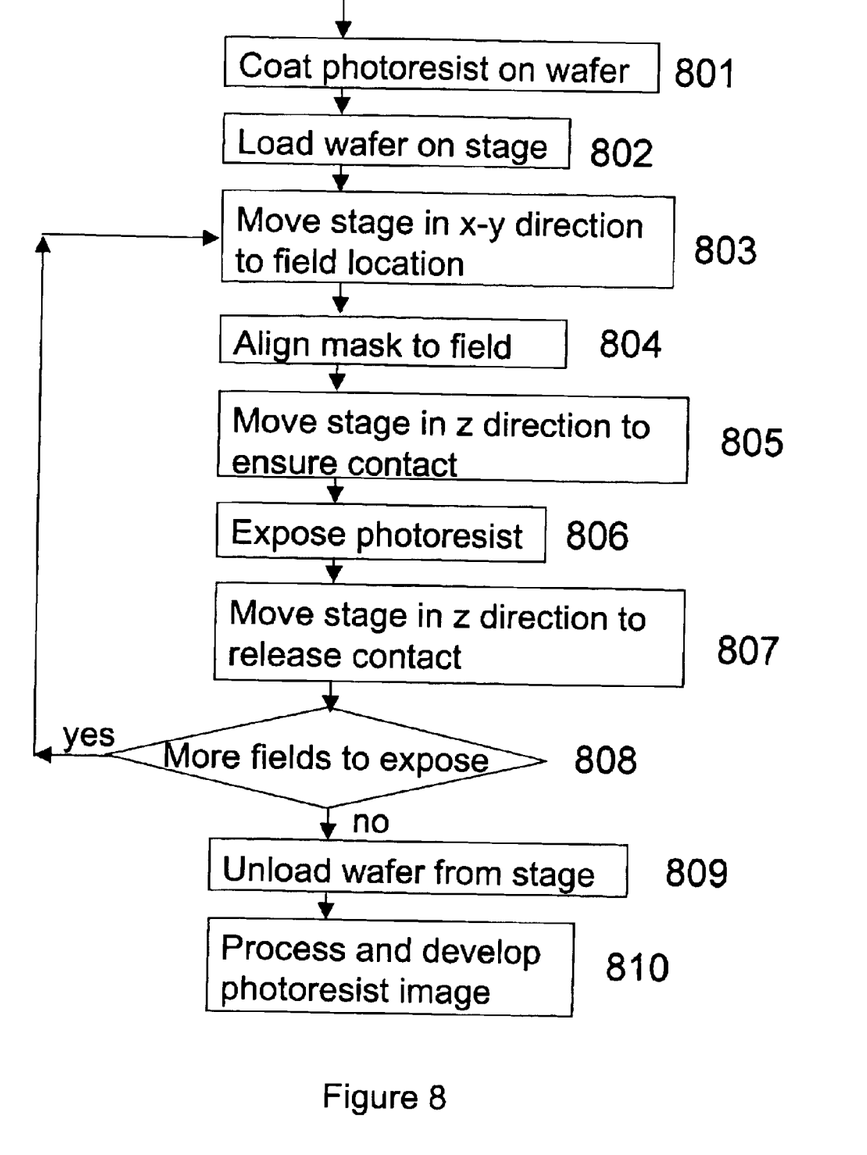
FIG. 8 illustrates the methodology used to expose wafers with a local wafer field to mask alignment.

As the image on the mask is magnified compared to the expected wafer image, multiple exposures will be required to expose an entire wafer. FIG. 7 describes the required flow to expose and process an entire wafer when he wafer is aligned globally to the mask through an alignment step. The resist is first coated on the wafer (701), and then the wafer is loaded onto the stage (702). The wafer is aligned to the mask (703) using global alignment keys on the wafer. The stage is moved to the location of the first field to be exposed (704). The stage is then moved up in contact with the wafer (705). The resist is then exposed to the desired exposure dose (706). The stage is then moved down to release the wafer from the lens (707). If more fields need to be exposed (708) the stage moves to the location of the next field to expose and the same procedure is repeated. When all the fields are exposed, the wafer is unloaded from the stage (709) and the resist is processed (710). In FIG. 8, the alignment is performed for each field individually. The resist is first coated on the wafer (801), and then the wafer is loaded onto the stage (802). The stage is moved to the location of the first field to be exposed (803). The field to be exposed is aligned to the mask (804) using global alignment keys on the wafer. The stage is then moved up in contact with the wafer (805). The resist is then exposed to the desired exposure dose (806). The stage is then moved down to release the wafer from the lens (807). If more fields need to be exposed (808) the stage moves to the location of the next field to expose and the same procedure is repeated. When all the fields are exposed, the wafer is unloaded from the stage (809) and the resist is processed (810). For both FIG. 7 and FIG. 8, the resist could be dispensed on the wafer before each exposure is performed. For both FIG. 7 and FIG. 8, the exposure tool could have more than one stage. While one stage is placed under to the lens for a wafer placed on the stage to be exposed, another wafer could be loaded on another stage and pre-aligned. The main purpose of having multiple stages would be to increase the overall throughput of the exposure tool.

Preferably, the exposure for a given field is performed as a whole in which the entire field is imaged by the imaging system onto the wafer (stepper mode). If the resist has a sufficiently low viscosity, the field can be scanned (scanner mode). The lens elements are typically circular. To avoid neighboring fields overlapping, the final lens element can be shaped into the geometry of the field, for example the final lens element may be rectangular or square. The typical field sizes for current stepper and scanner is a rectangle (or square) on the order of 20 to 40 mm in each direction. This reduced field size (typically less than 2000 $mm^2$) compared with the previous non-magnified implementations (which needs to cover the entire wafer as a whole), in combination with printing with a magnified mask image (such that mask critical dimension tolerance is relaxed), makes contact printing described in the present invention more viable than the previous non-magnified implementations. The reduced field size also makes the resist less prone to sticking to the lens.

As far as alignment is concerned, the global or local alignment systems can re-use existing alignment systems where the position of alignment keys on the mask is compared to the position of alignment keys on the wafer using an optical beam either going through the projection lens or going through an optical system adjacent to the projection lens.

The exposure systems described in FIG. 3a and FIG. 6 could also be used to produce an image on the wafer without the need for a mask. In this case, the mask would be replaced by a radiation source. An image of the source would be created on the wafer in the form of a small exposed area. The image of the source could be scanned on the wafer using a deflection mechanism like an acousto-optics modulator or a rotating mirror placed between the source and the projection lens. The source could be turned on and off to create the desired pattern on the wafer. The image of the source on the wafer could have a range of possible shapes in order to re-create the desired wafer image.

Despite the increased resolution provided by imaging into a high refractive index material, the distortion in the pattern transfer will require proximity effect correction as the feature size decreases. The design shapes must be modified in order to print the desired images on the wafer. To achieve an accurate correction of the layout, new models are required to account for the imaging into a high refractive index.

Modeling can be approximated using a conventional lithography simulator. Denoting the refractive index of the last lens element material by $n\_s$, modeling can be performed using a conventional simulator by specifying a wavelength given by the wavelength in vacuum divided by $n\_s$. Refractive indexes and extinction coefficients (n,k) of all materials in the wafer stack should also be divided by $n\_s$. Other parameters should remain unchanged. The simple approximation described above is adequate for first-order analysis. A more accurate modeling is necessary when the user is interested in secondary effects such as aberrations, focus errors, and the impact of mask topography on imaging. In these situations, the simulator should model the thin-film stack using $n\_s$ as the refractive index of the incident material. Spacing of the diffraction orders would change from $1/p$ to $1/(n\_s*p)$ (where p is the period of the printed feature) to reflect the capturing of more diffracted harmonics. The model should also include extensions of thin-film optics to accurately account for the thin film layers on the wafer. Alternatively, for the calculation of the propagation through the gap between the lens and the resist and the field inside the resist, Maxwell's equations can be solved using for example the FDTD (Finite Difference Time Domain) method. With these changes, modeling of secondary effects such as aberrations and mask topography becomes accurate.

The model built using this methodology can be used in many applications. It can be used to accurately correct the original layout to compensate for proximity effects or to verify the printing of a given layout or the correction of a layout after the compensations have been performed. This model can also be used to calculate the image of a given layout, determine its dose and focus latitude, or evaluate the printability of defects. Other uses of the model are the calculations of the optimum shifter width for alternating aperture phase-shifting mask, the optimum mask profile to balance the intensity between 0 and 180 degree phase regions in an alternating aperture phase-shifting mask, the optimum design shape sizing for attenuating phase-shifting mask, the optimum assist feature size and distance from the main feature, and the optimum illuminator setting for on-axis or off-axis illumination.

Figure 9:
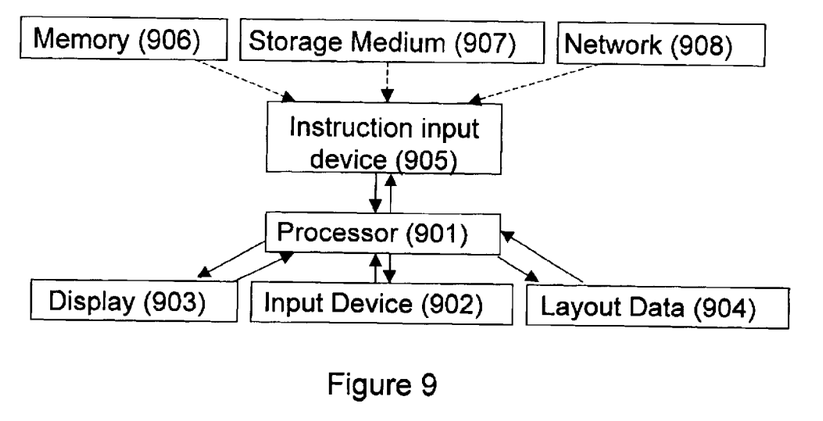
FIG. 9 is a block diagram of a computer system adapted for proximity effect correction according to the present invention.

FIG. 9 illustrates a computer system that can be used for one or more of the following tasks: correcting proximity effects on data layouts, verifying the correction, simulating the image of the layout, simulating the optimum shifter width for alternating aperture phase-shifting masks, simulating the optimum mask profile and dimension to balance the intensity between the 0 and 180 phase-shifting regions of an alternating aperture phase-shifting mask, simulating the optimum sizing for attenuating phase-shifting masks, simulating the optimum illuminator setting for on-axis or off-axis illumination. This computer system represents a wide variety of computer systems and computer architectures suitable for this application. A processor 901 is connected to receive data indicating user signals from user input device 902 and to provide data defining images to display 903. Processor 901 is also connected for accessing mask layout data 904, which define a mask layout under construction and a layout for a layer of material to be exposed using the mask. Processor 901 is also connected for receiving instruction data from instruction input device 905, which can provide instructions received from connections to memory 906, storage medium access device 907, or network 908.

Figure 10:
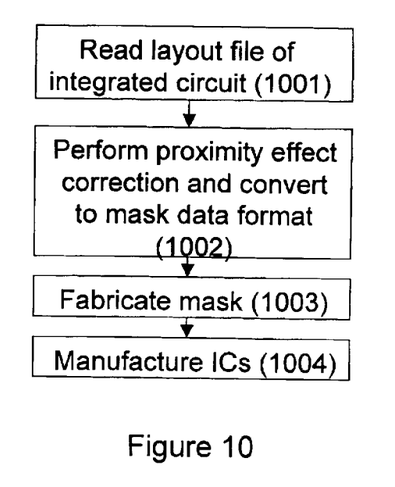
FIG. 10 is a flow chart for a process of integrated circuit manufacturing according to the present invention.

FIG. 10 illustrates the manufacturing process of an IC (Integrated Circuit). At step 1001, the layout file of the integrated circuit is first read using a computer system described in FIG. 9. At step 1002, the layout is corrected for proximity and the data is converted to mask data format. The correction of the data is only performed if required to meet the lithography specifications. The data resulting from step 1002 is used to create a mask at step 1003, and the mask is finally used in the fabrication process of an IC at step 1004. At least one lithographic step used to manufacture the IC in step 1004 uses one of the techniques described above from either, FIG. 3a or FIG. 6.

Figure 11:
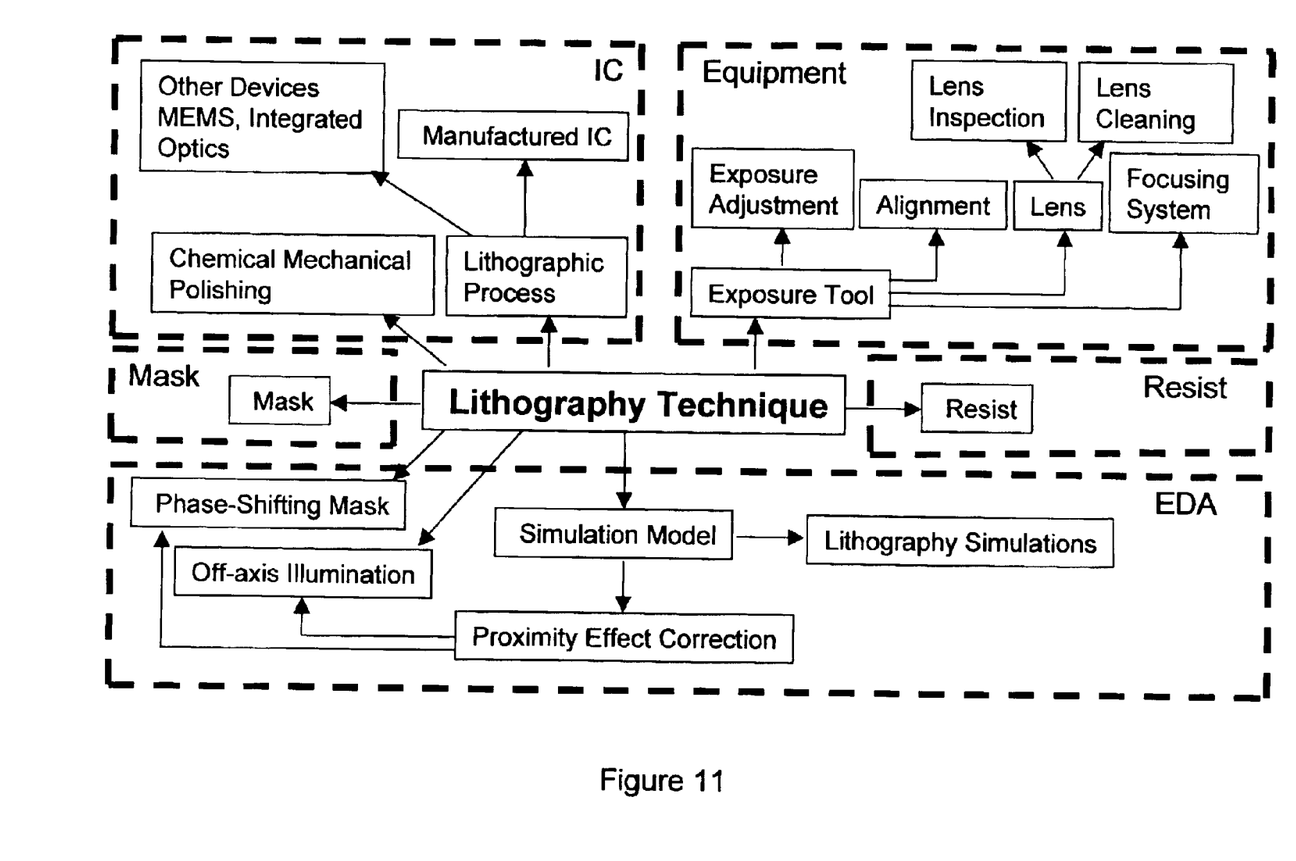
FIG. 11 provides a system view for contact lithography according to the present invention.

In summary, the present invention as described in FIG. 3a and FIG. 6 requires substantial modifications of many aspects of the semiconductor manufacturing process. FIG. 11 summarizes some of the ramifications of this technique that were described in more details in the previous paragraphs. The use of the invention directly impacts the following areas: Semiconductor-MEMs-integrated optics manufacturing, Mask manufacturing, EDA (Electronic Design Automation), Resist Manufacturing, and Lithography Equipment Manufacturing.

Conclusion

The data structures and code described in this description can be stored on a computer readable storage medium, which may be any device or medium that can store code and/or data for use by a computer system. This includes, but is not limited to, magnetic and optical storage devices such as disk drives, magnetic tapes, CD (compact discs) and DVD (digital video disks), and computer instruction signals embodied in a transmission medium. For example, the transmission medium may include a communication network, such as the Internet.

The invention can be applied to any binary masks, rim phase-shifting masks, chromeless phase-shifting masks, attenuated phase-shifting masks, alternating aperture phase-shifting masks used in single or multiple exposure methodologies.

The invention can be used to manufacture integrated circuits as well as other devices including for example quantum devices, integrated optics devices, bio-chips, MEMs and flat panel displays.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A lithography system comprising:
   a plurality of lens elements;
   the plurality of lens elements having a first lens element adapted to face a source of radiation, and having a final lens element comprising a removable slab of a material with an index of refraction greater than 1, and having a surface adapted to be pressed against a sample in order to form a depression at the surface of the sample facing the final lens element; and
   a stage to support said sample in contact with the surface of the final lens element.

2. The lithography system of claim 1, wherein the material of said final lens element comprises one of silicon dioxide, calcium fluoride, aluminum oxide, yttrium fluoride, lanthanum fluoride, and strontium fluoride.

3. The lithography system of claim 1, wherein said plurality of lens elements projects radiation having a wavelength of about 193 nm to the sample.

4. The lithography system of claim 1, wherein said plurality of lens elements projects radiation having a wavelength of about 157 nm to the sample.

5. The lithography system of claim 1, including a mask between the source of radiation and said plurality of lens elements, and said plurality of lens elements demagnifies an object on the mask by a factor greater than 4 at an image plane on or near said sample.

6. The lithography system of claim 1, including a mask between the source of radiation and said plurality of lens elements, and said plurality of lens elements projects an image of an object on the mask at an image plane on or near the surface of the final lens element.

7. The lithography system of claim 1, wherein said sample has a layer adapted to be developed in response to radiation projected by the plurality of lens elements.

8. The lithography system of claim 7, wherein said sample has a soft layer coated on top of said layer adapted to be developed in response to radiation projected by the plurality of lens elements.

9. The lithography system of claim 1, wherein a material adapted to be developed in response to radiation projected by the plurality of lens elements is dispensed on top of the sample before the final lens element is pressed against the sample.

10. A lithography system comprising:
a projection lens for imaging an object on a mask onto a sample, one side of the projection lens adapted to be pressed against the sample in order to form a depression at the surface of the sample facing the projection lens and an other side of the projection lens adapted to be placed in contact or close proximity with the mask; and
a stage to support said sample in contact with the projection lens;
wherein the other side of the projection lens placed in contact or close proximity with the mask comprises a removable slab of material.

11. The lithography system of claim 10, wherein a material of a lens element of said projection lens adapted to be placed in contact or close proximity with the mask, comprises a material including one of silicon dioxide, calcium fluoride, aluminum oxide, yttrium fluoride, lanthanum fluoride, and strontium fluoride.

12. The lithography system of claim 10, wherein said projection lens projects radiation having a wavelength of about 193 nm from the mask to the sample.

13. The lithography system of claim 10, wherein said projection lens projects radiation having a wavelength of about 157 nm from the mask to the sample.

14. The lithography system of claim 10, wherein said projection lens demagnifies an image on the mask by a factor greater than 4 at an image plane on or near said sample.

15. The lithography system of claim 10, wherein said projection lens, includes a lens element having a surface adapted to be pressed against the sample in order to form a depression at the surface of the sample facing the lens element, and the projection lens projects an image of a mask at an image plane on or near the surface of said lens element.

16. A lithography system comprising:
a projection lens for imaging an object on a mask onto a sample, one side of the projection lens adapted to be pressed against the sample in order to form a depression at the surface of the sample facing the projection lens and an other side of the projection lens adapted to be placed in contact or close proximity with the mask; and
a stage to support said sample in contact with the projection lens;
wherein said projection lens, includes a lens element having a surface adapted to be pressed against the sample in order to form a depression at the surface of the sample facing the lens, said lens element comprising a removable slab.

17. The lithography system of claim 16, wherein a material of a lens element of said projection lens adapted to be placed in contact or close proximity with the mask, comprises a material including one of silicon dioxide, calcium fluoride, aluminum oxide, yttrium fluoride, lanthanum fluoride, and strontium fluoride.

18. The lithography system of claim 16, wherein said projection lens projects radiation having a wavelength of about 193 nm from the mask to the sample.

19. The lithography system of claim 16, wherein said projection lens projects radiation having a wavelength of about 157 nm from the mask to the sample.

20. The lithography system of claim 16, wherein said projection lens demagnifies an image on the mask by a factor greater than 4 at an image plane on or near said sample.

21. The lithography system of claim 16, wherein said projection lens, includes a lens element having a surface adapted to be pressed against the sample in order to form a depression at the surface of the sample facing the lens element, and the projection lens projects an image of a mask at an image plane on or near the surface of said lens element.

* * * * *